United States Patent [19]

Burke, Jr.

[11] Patent Number: 5,113,068
[45] Date of Patent: May 12, 1992

[54] PHOTOELECTRICAL SENSOR WITH MULTISTAGED, FILTERED AMPLIFIER CIRCUIT

[75] Inventor: George E. Burke, Jr., Raleigh, N.C.

[73] Assignee: Square D Company, Palatine, Ill.

[21] Appl. No.: 635,031

[22] Filed: Dec. 28, 1990

[51] Int. Cl.⁵ ............................................. H01J 40/14
[52] U.S. Cl. .................................. 250/214 B; 330/107
[58] Field of Search ..................... 250/214 A, 214 B; 330/59, 107, 294, 308

[56] References Cited

U.S. PATENT DOCUMENTS

| | | | |
|---|---|---|---|
| 3,970,846 | 7/1976 | Schofield, Jr. et al. | 250/221 |
| 4,207,466 | 6/1980 | Drage et al. | 250/338 |
| 4,381,446 | 4/1983 | Fukuyama et al. | 250/214 R |
| 4,485,301 | 11/1984 | Gontowski, Jr. et al. | 250/214 A |
| 4,591,710 | 5/1986 | Komadina et al. | 250/221 |
| 4,749,853 | 6/1988 | Salim | 250/221 |
| 4,939,475 | 7/1990 | Prasse et al. | 330/59 |

Primary Examiner—David C. Nelms
Assistant Examiner—S. Allen
Attorney, Agent, or Firm—Michael J. Femal; James W. Potthast

[57] ABSTRACT

A photoelectrical sensor (10) provided with a multistaged, filtered amplifier circuit (16) for amplifying voltage pulses from a phototransducer (12) and a filtering I/V converter (14) includes three voltage amplifier stages (28, 30, 32) and three respectively associated band pass filters (34, 36 and 38) for cascade connecting the amplifier stages (28, 30, 32) between the phototransducer (12) and the detector circuit (18) and accumulating attenuation of response to signals at a frequency equal to the frequency of full wave rectified AC line voltage to maximize desensitization of the photoelectrical sensor (10) to AC powered ambient light fluctuations while broadening the pass band at the low frequency end for maximum response to the desired signal. A gain control circuit (40) is associated with the first stage amplifier (28), while a temperature compensation circuit (42) adjusts the gain of a second stage amplifier stage (30) to correct for temperature variations.

18 Claims, 2 Drawing Sheets

5,113,068

PHOTOELECTRICAL SENSOR WITH MULTISTAGED, FILTERED AMPLIFIER CIRCUIT

TECHNICAL BACKGROUND

This invention relates generally to a photoelectrical sensor and particularly to a photosensor with a filtered phototransducer amplifier circuit for reducing sensitivity to AC powered ambient light fluctuations of a predetermined frequency.

A problem which photoelectrical sensors of the type intended for use in environments including artificial light, such as remote control devices, security alarms and the like, is false detection due to artificial light fluctuations caused by AC powered ambient light sources. Such photoelectrical sensors are used in systems that employ light transmitters to generate pulses of light. These light pulses must be correctly sensed and decoded by appropriate detection logic circuitry of the photoelectrical sensor. If compensation for artificial AC light fluctuations produced at the frequency of full wave rectified standard AC line voltage is not provided, then such fluctuations alone, or in combination with other nonperiodic electrical noise, can cause the detection logic circuitry to falsely sense transmission of a valid light pulse from the light transmitter.

A number of patents address light noise problems. In U.S. Pat. No. 4,331,446 issued Apr. 16, 1983 to Fukuyama et al., mutual interference protection is provided. In U.S. Pat. No. 4,207,466 issued Jun. 10, 1980, to Drage et al., other light radiation and electrical signal noise sensed by the detector are filtered from the output signal according to the pulse width and frequency of pulse radiation generated by an emitter. A high pass filter is similarly used in U.S. Pat. No. 4,591,710 issued May 17, 1986 to Komadina et al. Other techniques are shown in U.S. Pat. Nos. 3,970,846 issued Jul. 20, 1976 to Shofield, Jr. et al. and 4,749,853 issued Jun. 7, 1988 to Salim.

A problem with such photoelectrical sensors is that in their amplification stage, insufficient filtering is provided for the level of amplification such that errors due to ambient light fluctuations can still occur. In addition, the pass bands response transition between attenuation to passing, or nonattenuation, is gradual which reduces the low frequency limit of the range of acceptable signal frequencies which must be sufficiently spaced on the frequency spectrum from the frequency of AC light fluctuation to achieve maximum insensitivity to ambient light. Since High pass transition can be located closer to the AC light fluctuation frequency, then the range of acceptable signal frequencies cannot be enlarged and the low pass transition cannot be moved downward for improved high frequency noise insensitivity.

SUMMARY OF THE INVENTION

It is therefore the primary object of the present invention to provide a photoelectrical sensor with multistaged, filtered amplifier circuitry for providing improved immunity to both AC powered ambient light fluctuations and high frequency noise while widening the range of response to desired signal frequencies.

This object is achieved through provision of a photoelectrical sensor subject to ambient, artificial AC powered light fluctuations and having a detector circuit for discriminating voltage pulses of a selected width and repetition rate, a phototransducer for converting light pulses to current pulses and a filtering current to voltage converter for converting the current pulses to filtered voltage pulses with a high gain, multistaged, filtered amplifier circuit for amplifying the filtered voltage pulses to a level for optimum response thereto by the logic circuit, comprising a plurality of voltage amplifier stages and means for interconnecting the plurality of voltage amplifier stages in cascade between the filtering current to voltage converter and the detector circuit. The interconnecting means advantageously includes a plurality of filters respectively associated with the plurality of amplifier stages and each of the plurality of filters substantially attenuates the response of the amplifier stage associated therewith to signals at the frequency of said AC powered light fluctuations to lower the low end of the bandwidth for desired signals. In a preferred embodiment at least three amplifier stages are employed, each with an associated band pass filter, to achieve the requisite response transition to achieve substantial lowering of the low end of the bandwidth of desired signals.

Another object is to provide such photoelectrical sensor in which the filtering current to voltage converter and all the plurality of amplifier stages are substantially identical and are at least partially contained within a single integrated circuit package for reduced noise.

Still a further object is to provide such a photoelectrical sensor with a gain control circuit for selectively attenuating gain of at least one of the voltage amplifier stages.

Yet another object is to provide such a photoelectrical sensor with a temperature compensation circuit for automatically adjusting the gain of another of said plurality of voltage amplifier stages other than said first one of the plurality of amplifier stages.

BRIEF DESCRIPTION OF THE DRAWINGS

The foregoing objects and advantageous features of the invention will be explained in greater detail and others will be made apparent from the detailed description of the preferred embodiment of the present invention which is given with reference to the figures of the drawing, in which.

TECHNICAL DESCRIPTION

Figure 1:
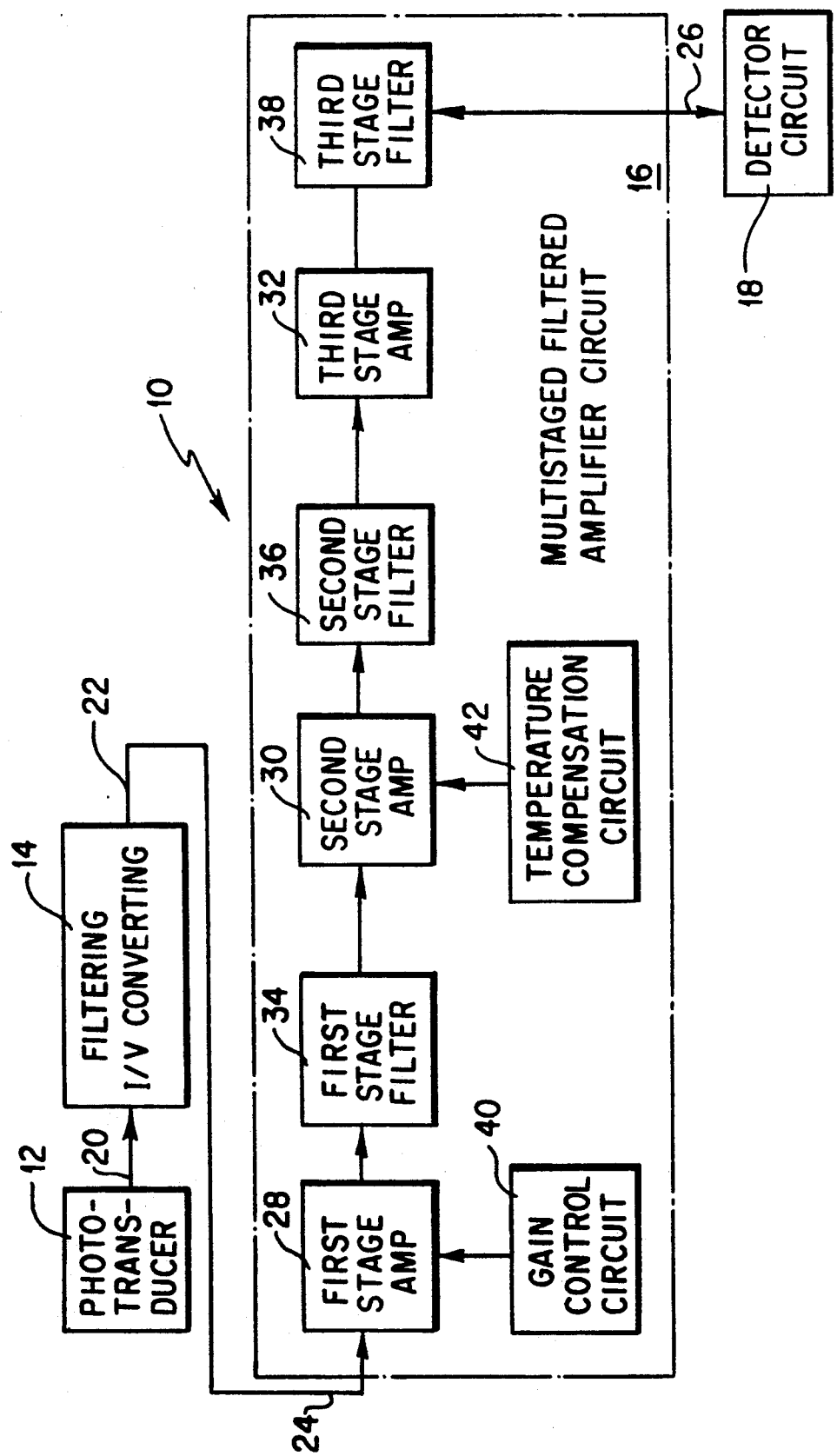
FIG. 1 is a functional block diagram of the preferred embodiment of the photoelectrical sensor of the present invention.

Referring now to FIG. 1, the preferred embodiment of the photoelectrical sensor 10 is seen to include a phototransducer 12; a filtering current to voltage, or I/V, converter 14; the novel high gain, multistaged, filtered amplifier circuit 16 of the present invention and a detector circuit 18. The phototransducer 12 has a photodiode which generates on an output 20 a small current signal in a response to receipt of light pulses from a light emitter (not shown). The current at output 20 is applied to the filtering I/V converter 14 which filters and converts the current signal to a corresponding small voltage signal produced on its output 22. This filtering I/V converter 14 includes a high pass filter which attenuates current signals having frequencies less than the desired signal, or communication, frequency of operation which is selected to be greater than the frequency of AC powered light fluctuations. For a 60 Hz power line the frequency of AC powered light fluctuations is 120 Hz or twice the AC power frequency. This small filtered voltage signal on output 20 is applied to an input 24 of the multistaged, filtered amplifier circuit 16.

The multistaged, filtered amplifier circuit 16 amplifies and filters the small voltage signal with a plurality of alternately cascaded amplifier and filter stages to produce a corresponding amplified, filtered voltage signal on its output 26 which is applied to the detector circuit 18. The detector circuit 18 is a digital circuit which discriminates pulses of a selected width and repetition rate in a conventional manner to produce one or more outputs associated with different functions. The details of the detector circuit 18 vary depending upon the desired functions to be performed and coding employed, but in the preferred embodiment, the detector circuit 18 responds to voltage signal pulse widths of approximately three to forty microseconds.

Still referring to FIG. 1, the multistaged, filtered amplifier circuit 16 has a plurality of amplifier stages 28, 30 and 32 and means including band pass filters 34, 36 and 38 respectively associated with the plurality of voltage amplifier 28, 30 and 32 for interconnecting them in cascade between the input 24 and output 26. The filters 34, 36 and 38 maximize attenuation of the response of the amplifier stages 28, 30 and 32, respectively, to signals having frequencies approximately equal to 120 Hz.

Preferably, each of the filters 34, 36 and 38 has a high pass filter section for attenuating response of its associated voltage amplifier stage to signals with a frequency less than the frequency of the desired signal to be sensed. This desired signal frequency is selected to be sufficiently higher than 120 Hz so to achieve maximum attenuation of signals at the frequency of 120 Hz. The high pass filter sections are also designed through use of conventional filter design formulas to pass without significant attenuation a signal pulse width of approximately three to forty microseconds. The high pass filters must also be set so as not to create unsatisfactory droop of the desired pulse. The selection of filter parameters is also chosen so that an extra pulse is not generated at output 26 for a single input pulse at input 24 since all acceptable signals arrive in multiples.

Each of the filters 34, 36 and 38 also includes a low pass filter section for attenuating response of the associated amplifier stage for signals with frequencies greater than the desired signal frequency to reduce high frequency noise. Preferably, a single low pass filter is shared by all the filters. Thus, the high pass and low pass filter sections cooperate to attenuate response of the associated amplifier stages to signals with frequencies exclusive of a range of frequencies inclusive of the preselected signal frequency and exclusive of the frequency of AC powered light fluctuations. Preferably, the filters 34, 36 and 38 are substantially identical as also are their voltage amplifiers 28, 30 and 32.

The multistaged, filtered amplifier circuit 16 also includes a gain control circuit 40 connected to one of the voltage amplifier stages 28, 30 and 32. In keeping with one aspect of the invention, the gain control circuit 40 is associated with the first stage amplifier 28 to avoid inadvertent, incorrect gain setting because of failure of a voltage amplifier stage (due to an excessive input signal, for instance) prior to the gain control circuit 40.

The multistaged, filtered amplifier circuit 16 also includes a temperature compensation circuit 42. In keeping with another aspect of the invention, the temperature compensation circuit is associated with a voltage amplifier stage other than the stage associated with the gain control circuit 40, so that they operate independently of each other. Preferably, with the gain control circuit 40 associated with the first stage amplifier 28, the temperature compensation circuit is associated with the second stage amplifier 30.

Figure 2:
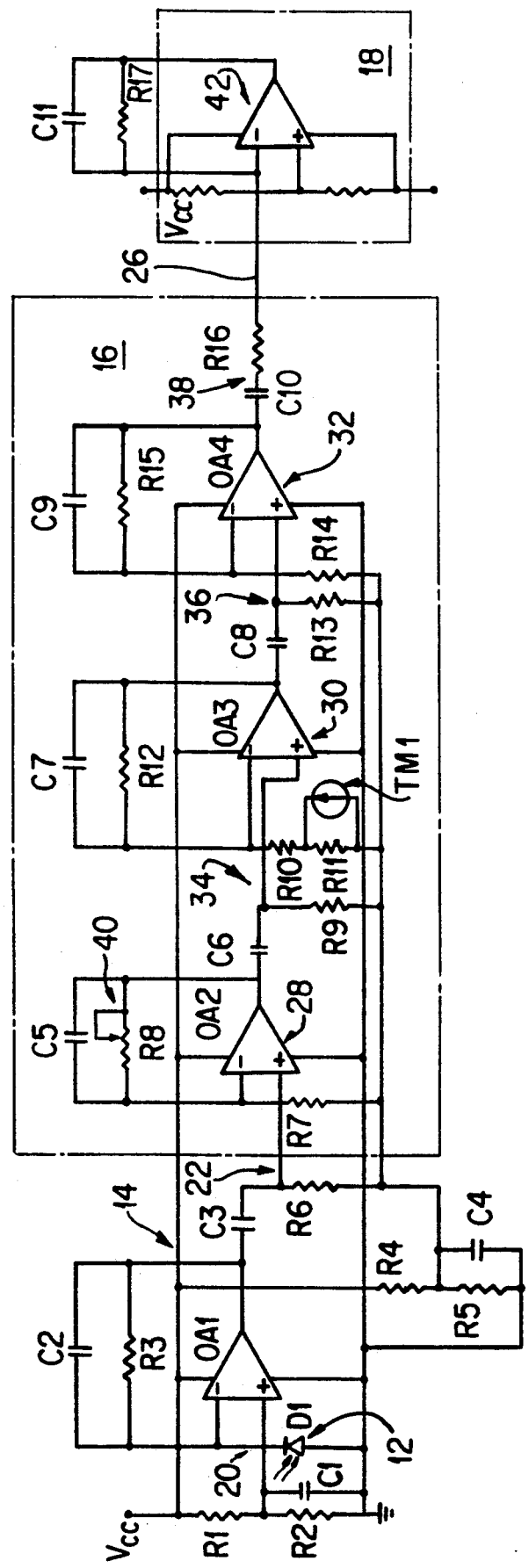
FIG. 2 is a schematic of a preferred circuit for implementing the functional block diagram of FIG. 1.

Referring now to FIG. 2, the preferred circuitry for implementation of the photoelectrical sensor 10 of FIG. 1 is seen to include a photodiode D1. The photodiode D1 is connected with the negative input of an operational amplifier OA1 forming part of the filtering I/V converter 14 to define the phototransducer block 12. Light pulses which impinge photodiode D1 cause current pulses to flow from the cathode to the anode of diode D1. The operational amplifier OA1 is configured as a current to voltage converter. A voltage divider formed of a series connection of resistors R1 and R2 between a source of positive DC power supply VCC and ground reference potential provides DC bias for the positive input of the operational amplifier OA1, so that the current pulses at the negative input of operational amplifier OA1 are converted to voltage pulses at the output which are equal to the magnitude of the current times the magnitude of resistor R3. Capacitor C2, connected in parallel with resistor R3, provides high frequency noise filtering in the feedback loop, while a capacitor C3 in cooperation with a resistor R6 provides high frequency filtering to separate desired signal pulses from 120 Hz signals caused by the artificial light. Advantageously, resistors R4, R5 and capacitor C4 perform multiple functions by providing DC bias and low pass filtering for all three of the voltage amplifier stages 28, 30 and 32 and may be considered a low pass filter section of each of the filter functional blocks 34, 36 and 38 of FIG. 1.

The three amplifier stages 28, 30 and 32 respectively comprise operational amplifiers OA2, OA3 and OA4 which are configured to function as voltage amplifiers with a high gain bandwidth product and which preferably operate with a regulated DC supply voltage of approximately five volts. The high pass sections of filters 34, 36 and 38 are respectively formed by a capacitor C6 and a resistor R9; a capacitor C8 and a resistor R13; and a capacitor C10 and a resistor R16. A capacitor C6 interconnects the output of operational amplifier OA2 of the first amplifier stage 28 to the positive input of the operational amplifier OA3. A capacitor C8 interconnects the output of the operational amplifier OA3 to the positive input of operational amplifier OA4 of the third stage amplifier 32. A capacitor C10 interconnects the output of operational amplifier OA4 to the output 26 of the multistaged, filtered amplifier circuit which, in turn, is coupled to the negative input of an operational amplifier input stage 42 of the detector circuit 18.

Preferably, all four operational amplifiers are contained in a single integrated package for reduced noise sensitivity and cost of assembly.

A negative feedback resistor R17 interconnected between the output of operational amplifier 42 and its negative input establishes the level of gain, while a capacitor C11 connected in parallel provides high frequency noise filtering. Similarly, resistors R8, R12 and R15 establish gain levels for operational amplifiers OA2, OA3 and OA4, respectively, while parallel connected capacitors C5, C7 and C9 provide high frequency noise filtering for the feedback loops of these operational amplifiers, respectively.

Resistor R8 is preferably a potentiometer resistor which defines the gain control circuit 40 associated with the operational amplifier OA2 of the first voltage amplifier stage 28.

The temperature compensation circuit 42 is preferably defined by providing resistor R11 connected with the operational amplifier of the second voltage amplifier stage 30 in the form of a thermistor. In this way, the variations due to changes in temperature of the photoelectricl sensor 10 are compensated independently of the gain control circuit of the first stage.

While other devices can be employed to implement the circuit of FIG. 2, the following is a list of components and values of various ones of the circuit elements of FIG. 2 which are preferred.

| Name | Designation | Type/Value |
| --- | --- | --- |
| operational amplifiers | OA1-OA4 | Motorola MC33074 or RCA CA5470 |
| resistors | R1 | 130 Kohms |
|  | R2 | 5.6 Kohms |
|  | R3 | 5.1 Kohms |
|  | R4 | 20 Kohms |
|  | R5 | 2.7 Kohms |
|  | R6 | 51 Kohms |
|  | R7 | 5.6 Kohms |
|  | R8 | 100 Kohms |
|  | R9 | 100 Kohms (Bourns 3329 trimming potentiometer) |
|  | R10 | 16 Kohms |
|  | R11 | 25 Kohms |
|  | R12 | 510 Kohms |
|  | R13 | 100 Kohms |
|  | R14 | 33 Kohms |
|  | R15 | 390 Kohms |
|  | R16 | 160 Kohms |
|  | R17 | 160 Kohms |
| capacitors | C1 | 0.01 microfarad |
|  | C2 | 330 picofarad |
|  | C3 | 1000 picofarad |
|  | C4 | 1 microfarad |
|  | C5 | 10 picofarad |
|  | C6 | .01 microfarad |
|  | C7 | 4.7 picofarad |
|  | C8 | .01 microfarad |
|  | C9 | 10 picofarad |
|  | C10 | 390 picofarad |
|  | C11 | 15 picofarad |
| silicon pin photodiode | D1 | Siemens BPX61 |
| thermistor | TM1 | Keystone Carbon Co. RL1007-13.8K-120-01 25 Kohms |

While a preferred embodiment has been disclosed in detail, it should be appreciated that many variations may be made thereto without departing from the scope of the invention as defined in the appended claims. For instance, the preferred embodiment is designed to maximize attenuation of signals at 120 Hz and is based on a presumed AC power line frequency of 120 Hz, and accordingly, if the ambient light fluctuated at 100 Hz because of a 50 Hz AC power line, the filter parameters would be selected to maximize attenuation of signals at 100 Hz and not 120 Hz. Also, while only three stages of filters and amplifiers are used, it should be appreciated that additional filter stages would narrow the high pass transition or gap between the frequency of maximum and minimum attenuation to enable selection of a desired signal range of frequencies closer to the frequency of the AC powered light fluctuations and thereby widen the desired signal range even further.

I claim:

1. In a photoelectrical sensor subject to ambient, artificial AC powered light fluctuations having a detector circuit for discriminating voltage pulses of a selected width and repetition rate, a phototransducer for converting light pulses to current pulses and a filtering current to voltage converter for converting the current pulses to filtered voltage pulses, the improvement being a high gain, multistaged, filtered amplifier circuit for amplifying the filtered voltage pulses to a level for optimum response thereto by the detector circuit, comprising:
   a plurality of voltage amplifier stages; and
   means for interconnecting the plurality of voltage amplifier stages in cascade between the filtering current to voltage converter and the detector circuit including a plurality of filters respectively associated with the plurality of amplifier stages, each of the plurality of filters substantially attenuating the response of the amplifier stage associated therewith to signals at the frequency of said AC powered light fluctuations.

2. The photoelectrical sensor of claim 1 in which each of said filters is a band pass filter for attenuating response of the associated amplifier stage for signals outside of a frequency range inclusive of a preselected signal frequency and exclusive of the AC powered light fluctuations.

3. The photoelectrical sensor of claim 1 in which each of said filters has a high pass filter section for attenuating response of the associated amplifier stage for signals having frequencies less than a preselected signal frequency which is not less than the frequency of the AC powered light fluctuations.

4. The photoelectrical sensor of claim 1 in which said multistaged, filtered amplifier circuit has a low pass filter section for attenuating response of all the amplifier stages for frequencies greater than a preselected signal frequency which is greater than the frequency of the AC powered light fluctuations and a maximum desired signal frequency.

5. The photoelectrical sensor of claim 1 in which each of the voltage amplifiers are substantially identical to one another.

6. The photoelectrical sensor of claim 1 in which each of the filters produce a response which is substantially the same for all of the plurality of amplifier stages.

7. The photoelectrical sensor of claim 1 in which at least two amplifier stages are interconnected in cascade by interconnecting means including high pass filters respectively associated therewith.

8. The photoelectrical sensor of claim 1 in which at least three amplifier stages are interconnected in cascade by interconnecting means including three filters respectively associated therewith.

9. The photoelectrical sensor of claim 1 in which the frequency of AC powered light fluctuations is the 120 Hz frequency associated with artificial light fluctuation caused by a standard AC voltage frequency of 60 Hz.

10. The photoelectrical sensor of claim 1 in which said filtering current to voltage converter includes a high pass filter for attenuating its response to AC powered current fluctuations.

11. The photoelectrical sensor of claim 1 in which the filtering current to voltage converter and all the plurality of amplifier stages are at least partially contained within a single integrated circuit package.

12. The photoelectrical sensor of claim 1 in which all of said voltage amplifier stages are operational amplifiers configured as voltage gain amplifiers.

13. The photoelectrical sensor of claim 1 in which the filtering current to voltage converter includes an operational amplifier contained in an integrated package together with the operational amplifiers of the amplifier stages.

14. The photoelectrical sensor of claim 1 in which each of said plurality of filters provides a response with maximum attenuation to signals with a frequency of 120 Hz while passing pulses having a duration in the range of three to forty microseconds.

15. The photoelectrical sensor of claim 1 including a gain control circuit for selectively attenuating gain of at least one of the voltage amplifier stages.

16. The photoelectrical sensor of claim 15 in which the gain control circuit is connected with a first one of said plurality of stages which is connected with the filtering current to voltage converter.

17. The photoelectrical sensor of claim 15 including a temperature compensation circuit for automatically adjusting the gain of another of said plurality of voltage amplifier stages other than said one of the plurality of amplifier stages.

18. The photoelectrical sensor of claim 17 in which said other one of the plurality of voltage amplifier stages is a second voltage amplifier stage connected with the output of said one amplifier stage.

* * * * *